United States Patent
Hoehn et al.

(10) Patent No.: US 9,224,924 B2
(45) Date of Patent: Dec. 29, 2015

(54) OPTOELECTRONIC COMPONENT INCLUDING AN ADHESIVE LAYER AND METHOD FOR PRODUCING THE SAME

(71) Applicant: OSRAM Opto Semiconductors GmbH, Regensburg (DE)

(72) Inventors: Klaus Hoehn, Forcheim (DE); Reinhard Streitel, Laaber (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/347,985

(22) PCT Filed: Sep. 24, 2012

(86) PCT No.: PCT/EP2012/068782
§ 371 (c)(1),
(2) Date: Mar. 27, 2014

(87) PCT Pub. No.: WO2013/045398
PCT Pub. Date: Apr. 4, 2013

(65) Prior Publication Data
US 2014/0225148 A1    Aug. 14, 2014

(30) Foreign Application Priority Data
Sep. 30, 2011 (DE) .......... 10 2011 114 559

(51) Int. Cl.
*H01L 33/48* (2010.01)
*H01L 31/02* (2006.01)
(Continued)

(52) U.S. Cl.
CPC .......... *H01L 33/48* (2013.01); *C08G 59/62* (2013.01); *C08G 59/687* (2013.01); *C09J 163/00* (2013.01); *H01L 31/02* (2013.01); H01L 2224/2919 (2013.01); H01L 2224/2929 (2013.01); H01L 2224/32145 (2013.01); H01L 2224/32225 (2013.01); H01L 2224/48227 (2013.01);
(Continued)

(58) Field of Classification Search
CPC .............. H01L 2224/2919; H01L 2224/2929; H01L 2224/32145; H01L 2924/0665
See application file for complete search history.

(56) References Cited

U.S. PATENT DOCUMENTS 5,484,823 A * 1/1996 Noguchi et al. ................ 522/92
6,080,520 A * 6/2000 Polykarpov et al. .......... 430/138
(Continued)

FOREIGN PATENT DOCUMENTS

DE    10204386 A1    4/2003
DE    10213294 A1    10/2003
(Continued)

OTHER PUBLICATIONS

Database WPI Week 200414 Thomson Scientific, London, GB; AN 2004-142777 XP002690123, WO 03/106582 A1 (Sekisui Chem Co Ltd), Dec. 24, 2014, 4 pages.

*Primary Examiner* — Ida M Soward
(74) *Attorney, Agent, or Firm* — Slater & Matsil, L.L.P.

(57) ABSTRACT

An optoelectronic component includes at least one active semiconductor layer sequence, at least one first and one second element, and at least one adhesive layer arranged between at least one first element and at least one second element. The adhesive layer is produced from an adhesive that comprises at least a first monofunctional, difunctional or polyfunctional epoxy resin, an accelerator and an adhesion promoter.

18 Claims, 7 Drawing Sheets

(51) Int. Cl.
    *C09J 163/00* (2006.01)
    *C08G 59/62* (2006.01)
    *C08G 59/68* (2006.01)

(52) U.S. Cl.
    CPC ............. *H01L2224/73265* (2013.01); *H01L 2924/0665* (2013.01)

(56) References Cited

U.S. PATENT DOCUMENTS

| | | | |
|---|---|---|---|
| 6,627,683 B1 * | 9/2003 | Klemarczyk et al. | 523/457 |
| 6,734,569 B2 * | 5/2004 | Appelt et al. | 257/783 |
| 6,888,174 B2 * | 5/2005 | Hohn et al. | 257/100 |
| 7,455,461 B2 * | 11/2008 | Hohn et al. | 385/93 |
| 7,569,260 B2 * | 8/2009 | Miyazaki et al. | 428/1.53 |
| 8,617,427 B2 * | 12/2013 | Jiang et al. | 252/514 |
| 8,852,391 B2 * | 10/2014 | McCutcheon et al. | 156/714 |
| 2003/0132701 A1 | 7/2003 | Sato et al. | |
| 2004/0014240 A1 * | 1/2004 | Takeguchi et al. | 436/518 |
| 2005/0264194 A1 | 12/2005 | Ng et al. | |
| 2006/0073621 A1 * | 4/2006 | Kneissel et al. | 438/21 |
| 2006/0222999 A1 | 10/2006 | Miyazaki et al. | |
| 2009/0166665 A1 | 7/2009 | Haitko | |
| 2011/0013865 A1 * | 1/2011 | Shibata et al. | 385/14 |
| 2013/0012620 A1 * | 1/2013 | Dershem | 523/400 |
| 2013/0127022 A1 * | 5/2013 | Chien et al. | 257/632 |

FOREIGN PATENT DOCUMENTS

| | | |
|---|---|---|
| WO | 0118887 A1 | 3/2001 |
| WO | 0186730 A2 | 11/2001 |
| WO | 03106582 A1 | 12/2003 |
| WO | 2007036194 A1 | 4/2007 |

* cited by examiner

OPTOELECTRONIC COMPONENT INCLUDING AN ADHESIVE LAYER AND METHOD FOR PRODUCING THE SAME

This patent application is a national phase filing under section 371 of PCT/EP2012/068782, filed Sep. 24, 2012, which claims the priority of German patent application 10 2011 114 559.5, filed Sep. 30, 2011, each of which is incorporated herein by reference in its entirety.

TECHNICAL FIELD

The invention relates to an optoelectronic component including an adhesive layer between two elements, a method for producing an adhesive layer in an optoelectronic component, and the use of an adhesive to form adhesive layers in optoelectronic components.

BACKGROUND

Elements in optoelectronic components, such as light-emitting diodes (LEDs), are frequently bonded to one another by adhesive layers. Too little adhesion of the elements to be bonded often results in premature delamination of the bonded elements. Conventional adhesive layers are frequently susceptible to yellowing, can only be used at limited operating temperatures and can frequently be processed only with considerable technical complexity.

SUMMARY OF THE INVENTION

At least one embodiment of the present invention provides an optoelectronic component having an adhesive layer with improved properties. Embodiments provide a method for producing an adhesive layer with improved properties and the use of an adhesive to form adhesive layers with improved properties.

An optoelectronic component is specified. This includes at least one active semiconductor layer sequence, at least one first and one second element, and at least one adhesive layer which is arranged between at least one first element and at least one second element, in which the first element is selected from the active semiconductor layer sequence, a potting substance and a carrier, and in which the second element is selected from a carrier, an optical element and a substrate. The adhesive layer is produced from an adhesive which comprises at least a first difunctional or polyfunctional epoxy resin, an accelerator and an adhesion promoter. It is also possible for the adhesive to include a mixture of a plurality of first difunctional or polyfunctional epoxy resins. Further, the adhesive may include an aliphatic or cycloaliphatic alcohol.

Surprisingly, the inventors have found that an adhesive layer which is produced from this adhesive enables good bonding of a first and a second element in optoelectronic components. The good bonding of the first and the second elements prevents premature delamination of the elements and thus allows the service life of the optoelectronic component to be extended.

The adhesive layer may be applied over the full surface, in textured manner or at certain points between the first and the second element.

The adhesive layer may, for example, be arranged between a potting substance and an optical element and/or between a carrier and a substrate and/or between two carriers and/or between an active semiconductor layer sequence and a substrate and/or between a carrier and an optical element.

Thus, there may be arranged on the carrier of an optoelectronic component an adhesive layer on which, in turn, there is arranged an active semiconductor layer sequence including a substrate, wherein the substrate and the carrier are bonded to one another by the adhesive layer. The active semiconductor layer sequence is arranged with the outer face directly on the substrate.

It is also possible for the optoelectronic component to include a housing which has in the center a recess filled with a potting substance. An adhesive layer may be applied to the potting substance, with an optical element arranged above the adhesive layer. The optical element and the potting substance are bonded to one another by the adhesive layer.

It is also possible for an adhesive layer to be arranged between an active semiconductor layer sequence and a substrate and for these to be bonded to one another. In this case, the substrate may be part of a further active semiconductor layer sequence. In particular, it is possible for the first and the second and also further active semiconductor layer sequences including a substrate to be bonded to one another by the adhesive layer. The active semiconductor layer sequences are each arranged with the outer face directly on the substrate.

It is further possible for the adhesive layer to be arranged between two carriers.

The expression indicating that a layer or an element is arranged or applied "on" or "above" another layer or element may mean, here and below, that the one layer or element is arranged without any intermediary in direct mechanical and/or electrical contact on the other layer or element. Further, it may also mean that the one layer or element is arranged with an intermediary on or above the other layer or element. In this case, further layers and/or elements may be arranged between the one and the other layer or element.

The expression indicating that a layer or an element is arranged "between" two other layers or elements may mean, here and below, that the one layer or element is arranged without any intermediary in direct mechanical and/or electrical contact or in indirect contact with one of the two other layers or elements and in direct mechanical and/or electrical contact or in indirect contact with the other of the two other layers or elements. In this case, where there is indirect contact, further layers and/or elements may be arranged between the one and at least one of the two other layers or between the one and at least one of the two other elements.

The optoelectronic component may be one of the following: luminescent diodes, photodiodes, phototransistors, photoarrays/modules and optical couplers. In particular, the optoelectronic component may be one of the following: electronic and optoelectronic components capable of being surface mounted (SMDs), for example, for the automotive sector.

The active semiconductor layer sequence may take the form of an epitaxial layer sequence or a radiation-emitting semiconductor chip having an epitaxial layer sequence, that is to say a semiconductor layer sequence which has been grown by epitaxial means. In this case, the active semiconductor layer sequence may, for example, be formed on the basis of InGaAlN. InGaAlN-based semiconductor chips and semiconductor layer sequences include in particular those in which the semiconductor layer sequence formed by epitaxial means typically has a layer sequence of different individual layers and which contains at least one individual layer comprising a material from the III-V compound semiconductor material system $In_xAl_yGa_{1-x-y}N$, where $0 \leq x \leq 1$, $0 \leq y \leq 1$ and $x+y \leq 1$. Semiconductor layer sequences comprising at least one InGaAlN-based active layer may preferably, for example, emit electromagnetic radiation in the ultraviolet to green wavelength range.

Alternatively, or in addition, the semiconductor layer sequence or the semiconductor chip may also be based on InGaAlP, that is to say that the semiconductor layer sequence may have different individual layers, whereof at least one individual layer comprises a material from the III-V compound semiconductor material system $In_xAl_yGa_{1-x-y}P$, where $0 \leq x \leq 1$, $0 \leq y \leq 1$ and $x+y \leq 1$. Semiconductor layer sequences or semiconductor chips comprising at least one InGaAlP-based active layer may preferably, for example, emit electromagnetic radiation having one or more spectral components in the green to red wavelength range.

Alternatively or in addition, the semiconductor layer sequence or the semiconductor chip may also comprise other III-V compound semiconductor material systems, for example, an AlGaAs-based material, or II-VI compound semiconductor material systems. In particular, an active layer comprising an AlGaAs-based material may be suitable for emitting electromagnetic radiation having one or more spectral components in the red to infrared wavelength range.

In addition to the active layer, the active semiconductor layer sequence may include further functional layers and functional regions, such as p-doped or n-doped charge carrier transport layers, that is to say electron or hole transport layers, undoped or p-doped or n-doped confinement, cladding or waveguide layers, barrier layers, levelling layers, buffer layers, protective layers and/or electrodes and combinations thereof. Furthermore, one or more reflecting layers may be mounted for example on a side of the semiconductor layer sequence remote from the growing substrate. The structures described here in relation to the active layer or the further functional layers and regions are known to those skilled in the art, in particular as regards construction, function and structure, and so they are not described in more detail at this point.

The semiconductor layer sequence or the semiconductor chip may have edge lengths of less than 200 μm.

In a further embodiment of the optoelectronic component, there is direct contact between the adhesive layer and the first element and/or the second element. The term direct contact means that no layers or elements are arranged between the adhesive layer and the first element and/or the second element. The direct contact allows high adhesive strengths to be attained, which may be attributable to van der Waals interactions between the adhesive in the adhesive layer and the first and/or second element. Chemical bonds or hydrogen bridges between the adhesive layer and the first and/or second element are also possible.

The at least one first difunctional or polyfunctional epoxy resin may be selected from a group that comprises hydrogenated or unhydrogenated aromatic diglycidyl ethers, diglycidyl esters, glycidyl ethers, epoxidized olefins and cycloaliphatic epoxy resins. According to an embodiment, there are selected as the difunctional or polyfunctional epoxy resins diglycidyl ethers of bisphenol-A, diglycidyl ethers of bisphenol-F, difunctional or polyfunctional Phenol Novolac epoxy resins and/or 3,4-epoxycyclohexylmethyl-3,4-epoxycyclohexane carboxylate. Polyfunctional epoxy resins are typically more viscous and more strongly colored than difunctional epoxy resins. Moreover, polyfunctional epoxy resins may bring about a higher glass transition temperature in the adhesive layer than difunctional epoxy resins. It is possible for the polyfunctional epoxy resins to be solids. Thus, difunctional or polyfunctional epoxy resins may be used, depending on the application.

The accelerator primarily triggers the chemical crosslinking of the adhesive and supports the chemical reaction in the curing process. The chemical crosslinking takes place, for example, by way of a cationic mechanism. The accelerator may comprise a cationic photoinitiator, in particular a UV-cationic photoinitiator. Examples of cationic photoinitiators are alkylated and aromatic sulfonium and iodonium salts. Anions which may be used in the salts are, for example, $AsF_6^-$, $PF_6^-$, $SbF_6^-$ and $BF_4^-$. According to an embodiment, the accelerator used is an aromatic sulfonium salt. The accelerator may be used in solid form or dissolved. A suitable solvent is, for example, propylene carbonate. For example, the accelerator may comprise at least one triarylsulfonium hexafluoroantimonate salt. It is also possible for the accelerator to comprise diphenyl(4-phenylthiophenyl)sulfonium hexafluoroantimonate. The accelerator may be Unicure UVI 6976. Unicure UVI 6976 comprises mixtures of triarylsulfonium hexafluoroantimonate salts which contain diphenyl(4-phenylthiophenyl)sulfonium hexafluoroantimonate.

The adhesion promoter may be selected from a group comprising organofunctional silanes. Organofunctional silanes may, for example, be trialkoxysilane compounds such as γ-glycidoxypropyl trimethoxysilane or γ-glycidoxypropyl triethoxysilane. In particular, the alkyl radicals may not contain any functional groups which have a basic effect, such as amines. Alkyl radicals which do not have a basic effect are preferred. In particular, the alkyl radicals may have OH, epoxy or acrylic functions. In this way, the storage life of the adhesive may be extended and good adhesive crosslinking may be ensured. The organofunctional silanes may be substituted by glycidyl ethers such as trimethoxypropylglycidyl ether.

If the adhesive contains an aliphatic or cycloaliphatic alcohol, the latter may be selected from a group comprising ethanol, 1,2-propanediol, 1,4-butanediol, 1,6-hexanediol, tricyclodecanedimethanol, cyclohexanedimethanol, 2-ethyl-2-(hydroxymethyl)-1,3-propanediol, diethylene glycol, triethylene glycol, polyether polyols, dipropylene glycol, diethylene glycol monoalkyl ether, glycerine and isosorbide. In particular, the alcohol may be tricyclodecanedimethanol. The rheological, mechanical and thermomechanical properties and the wetting and flow behavior of the adhesive on the first element may be adjusted by adding the aliphatic or cycloaliphatic alcohol to give the desired application form and desired size of the drops of adhesive. By adding the aliphatic or cycloaliphatic alcohol, it is furthermore possible to obtain an adhesive layer having the desired target glass transition temperature (Tg). This ensures that the component will operate reliably under the thermomechanical stress conditions that occur when voltage is applied. The Tg that is adjusted is also largely maintained over the service life of the component without any substantial impairment under load from heat, light or moisture. The Tg of the adhesive layer lies in a range from 100° C. to 180° C., preferably in a range from 130° C. to 160° C. and particularly preferably in a range from 140° C. to 160° C. Adding the aliphatic or cycloaliphatic alcohol can reduce yellowing in the adhesive layer.

The adhesive layer contains structural elements of the components present in the adhesive. The adhesive crosslinks as a result of chemical reactions of the functional groups present in the adhesive.

The composition of the adhesive layer is selected such that it does not undergo, or undergoes only slight, yellowing and clouding and its mechanical properties are not or only hardly altered as a result of the loads from heat, moisture and radiation to which it may be exposed in an optoelectronic component. In this way it is also ensured that the light yield is not reduced, or is reduced only to a relatively small extent, and the radiation characteristics of the optoelectronic component are not changed or are changed only slightly if the adhesive layer is located in the ray path of the radiation emitted, for example, by an LED. The mechanical strength of the adhesive layer may also be largely maintained despite these loads. Moreover, it is possible largely to avoid the adhesive layer from becoming detached as a result of external stress loading.

In a further embodiment, the adhesive and the adhesive layer containing the adhesive are sufficiently stable under heat. Thus, they may be exposed, for example, to the conditions in a solder bath, which may be necessary, for example, for SMD mounting an SMD component, without being damaged, as a result of which functional disruptions in the component may be avoided.

In a further embodiment of the optoelectronic component, the adhesive layer has a shear strength of at least 2.0 MPa. Shear strength is the resistance that a solid body, that is to say the first and/or the second element, offers to tangential shear forces. It specifies the maximum shear stress by which an element can be loaded before it shears off. The shear strength is greater than 2 MPa, preferably greater than 10 MPa and particularly preferably greater than 20 MPa or 30 MPa. The greater the shear strength, the better the adhesion of the first and the second element to one another and the more a premature delamination of the elements is prevented.

In a further embodiment, the adhesive layer is transparent to radiation emitted by the active semiconductor layer sequence. The term "transparent" is understood here to mean that a material, layer or element is able to at least partly transmit radiation in the entire visible electromagnetic spectrum or a partial spectrum thereof. The radiation emitted by the active semiconductor layer sequence may, for example, lie in the visible range of the electromagnetic spectrum. The adhesive layer may in particular be constructed to be transparent and be arranged in the ray path of the radiation emitted by the active semiconductor layer sequence.

In a further embodiment, the adhesive layer has a refractive index $n_D$ at 23° C. of 1.48 to 1.58, in order to ensure there is good light output through the adhesive layer. A refractive index of this kind may have a similar value to the refractive indices of the first and/or second element, which further improves the light output. The refractive index may be adjusted by way of the composition and constituents of the adhesive. In general, aliphatic and cycloaliphatic constituents may reduce the refractive index, for example, to <1.5, while aromatic constituents may increase the refractive index, for example, to 1.58.

In a further embodiment, the adhesive layer has layer thicknesses of at most 50 µm, preferably from 1 µm to 20 µm and particularly preferably from 1 µm to 10 µm. These small layer thicknesses reduce the risk of ageing as a result of yellowing when the optoelectronic component is operated.

In a further embodiment, at least one of the first and the second elements contains sapphire. It is also possible for the first and the second element to contain sapphire. At least the element containing sapphire may be constructed to be transparent. Preferably, depending on the layer thickness of the element of transparent construction, the optical transmittance of light in a wavelength of 300 nm to 1100 nm lies between 80% and 100%, preferably between 85% and 100% and particularly preferably between 90% and 100%. The element or elements containing sapphire may thus be arranged in the ray path of an optoelectronic component. By optimizing the roughness of the surface of the first and/or second element, the transmittance behavior and the adhesive strength of the adhesive layer may be improved.

The term sapphire is to be understood as the composition $Al_2O_3$, in particular the α-modification, which has the following properties: its density ρ at 20° C. is between 3.95 g/cm³ and 4.03 g/cm³ and its Mohs hardness is 9. The melting point of sapphire is between 2030° C. and 2050° C. and it has a heat expansion coefficient of between 5.0 ppm/K and 6.6 ppm/K. Further, sapphire has a tensile strength of 275 MPa to 400 MPa and a modulus of elasticity (Young's modulus) of 345 MPa. The Poisson's ratio is 0.29. Finally, sapphire has a thermal conductivity of 23 W/mK at 23° C.

Elements that contain sapphire may thus dissipate the heat that is generated in optoelectronic components when the component is operated. Heat gradients that are produced may result in premature ageing of the optoelectronic component. Thus, the service life of the component may be increased by using elements containing sapphire. As a result of the high melting point of sapphire, elements containing sapphire can be used at high operating temperatures. As a result of the density and other mechanical properties, when elements containing sapphire are processed, material stability can be ensured and they can be operated reliably. As a result of the heat expansion coefficient, elements containing sapphire display high bond strength when there is a change in temperature or a thermal shock.

In a further embodiment of the optoelectronic component, the optical element is selected from a group comprising lenses, prisms and filters. The optical elements may be constructed to be transparent, for example, if they are located in the ray path of radiation emitted by the semiconductor layer sequence and the radiation is output from the component by way of the optical elements. The optical elements may comprise a material that is selected from glass, crystals, quartz, sapphire and/or synthetic materials. In particular, the optical element comprises a material made of sapphire. Sapphire gives the optical elements a high level of hardness and scratch resistance. Further, the optical elements may be planar, concave or convex in shape and may have a defined roughness and waviness. Also possible are sawtooth structures and elements comprising a plurality of part elements, for example, layers. For example, constructions of the optical element comprising a plurality of sapphire layers (multistack arrangement) are possible. The optical elements may be mounted with a planar face on the adhesive layer. Thus, in particular there cannot be any cavities between the adhesive layer and the optical element.

Optical elements may be the outermost element of an optoelectronic component and so form an interface with the atmosphere surrounding the component. For this reason, they should be stable in relation to external mechanical influences and at the same time protect the underlying layers and elements of the optoelectronic component. This may be ensured, for example, by the above-mentioned material properties of sapphire. In particular, sapphire gives the optical elements a high level of hardness and scratch resistance.

In a further embodiment of the optoelectronic component, the material of the carrier is selected from a group comprising sapphire, quartz, glass, metal, ceramic, polymers and semiconductor materials. The semiconductor materials may comprise Si, SiC, Ge and GaN. In particular, the carrier may be part of the active semiconductor layer sequence. According to an embodiment, the carrier comprises sapphire. In particular, the carrier may be constructed to be transparent if it is located in the ray path of the radiation emitted, for example, from an LED.

In a further embodiment of the optoelectronic component, the material of the substrate is selected from a group comprising sapphire or glass. For example, the glass may be a quartz glass. Because of the low heat expansion coefficient of approximately 0.5 ppm/K, a stable thermomechanical adjustment may be made. Also possible are glass types having a refractive index greater than 1.5 at 25° C., in order to attain improved light output. According to an embodiment, the substrate comprises sapphire. In particular, the substrate may be constructed to be transparent if it is located in the ray path of the radiation emitted, for example, from an LED. The substrate may be part of an active semiconductor layer sequence.

Once the semiconductor layer sequence has been grown, the substrate, which is the second element in the component, may be thinned to adjust to the desired thickness. This step may be performed in particular if the substrate is formed from sapphire. The layer thicknesses of the substrate are, for example, between 0.1 nm and 1.0 nm.

The active semiconductor layer sequence may be bonded by means of the adhesive layer to the first element, for example, a carrier, directly after the thinning process of the substrate, wherein a good adhesive strength between the carrier and the substrate and precise fixing of the two elements to one another are ensured. In particular, this is possible if the substrate contains sapphire. Active semiconductor layer sequences which include a substrate containing sapphire may have higher light yields and give brighter LEDs. It is also possible, after the thinning process, for the substrate first to be optically polished before it is bonded to the first element by means of an adhesive layer.

In a further embodiment of the optoelectronic component, the material of the potting substance is selected from a group comprising sapphire, quartz, glass and polymers. Polymers may, for example, be epoxy resins or silicones. In particular, the potting substance may be constructed to be transparent if it is located in the ray path of the radiation emitted, for example, from an LED.

In a further embodiment, the potting substance comprises a conversion material or particles of a conversion material. It is possible for the conversion material to be a luminescent material. The conversion material partly or completely converts the electromagnetic radiation emitted by the active semiconductor layer sequence into radiation having a different wavelength.

According to a further embodiment, the optoelectronic component comprises a luminescent conversion layer. The luminescent conversion layer is preferably located in the ray path of the radiation emitted by an active semiconductor layer sequence. The luminescent conversion layer partly or completely converts the electromagnetic radiation emitted by the active semiconductor layer sequence into radiation having a different wavelength. In the case of partial conversion, the radiation emitted by the component is composed of the radiation emitted by the active semiconductor layer sequence and the converted radiation. In this way, the optoelectronic component may, for example, emit mixed-color light, in particular white light.

In a preferred embodiment, the active semiconductor layer sequence and the luminescent conversion layer are spatially separated from one another. This means that at least one layer or element is located between the active semiconductor layer sequence and the luminescent conversion layer, and the active semiconductor layer sequence and the luminescent conversion layer are in particular not in direct contact with one another. In this way, it may largely be ensured that as little as possible of the heat generated by the active semiconductor layer sequence is transmitted to the luminescent conversion layer, or that there are no heat gradients in the luminescent conversion layer which would result in inhomogeneously output light in LEDs.

According to an embodiment, the luminescent conversion layer is arranged on the carrier. Preferably, the luminescent conversion layer is arranged on the side of the carrier remote from the active semiconductor layer sequence. In this embodiment, the carrier may, for example, contain sapphire. It is also possible for the luminescent conversion layer to be arranged between the carrier and the optical element. According to this embodiment, the optical element is arranged on the carrier. Preferably, the optical element is arranged on the side of the carrier remote from the active semiconductor layer sequence. As a result of the carrier that contains sapphire, the heat generated can be dissipated away from the active semiconductor layer sequence particularly well, or can contribute to more uniform heat distribution within the component. Thus, there are preferably no heat gradients in the luminescent conversion layer and the optical element, and this can ensure a homogeneous radiation characteristic.

It is also possible for the luminescent conversion layer to be arranged between two optical elements. The optical elements may, for example, be a filter and a lens which are constructed to be transparent and, for example, contain sapphire.

Furthermore, a method for producing an adhesive layer between two elements in an optoelectronic component is specified. The method comprises the following method steps:
  A) providing a first element,
  B) applying an adhesive,
  C) positioning a second element,
  D) curing the adhesive.

Thus, in method step D), an adhesive layer may be formed between the first and the second element. By applying an adhesive and curing the adhesive, a first and a second element may be bonded to one another. Once the adhesive has cured completely, the adhesive layer produced displays no or only slight optical inhomogeneities, such as air inclusions and cracks.

By means of a method of this kind, it is possible to produce an optoelectronic component according to the embodiments above.

The method is suitable for producing LEDs in economical and efficient mass-production assembly.

The adhesive selected may be an adhesive that corresponds to the adhesive disclosed in relation to the adhesive layer of the optoelectronic component.

In method step B), the adhesive may be applied at certain points, in lines or over the surface. Thus, the adhesive layer produced may be applied at certain points, in textured manner or over the full surface between the first and the second element.

In method step B), the adhesive may be applied by means of a dispenser, for example, by means of a needle dispenser. As an alternative, in method step B) the adhesive may be applied by a jet, spray or spincoat method, by a stamping technique or by screen printing.

The viscosity of the adhesive may be adapted to the technology in method step B), the flow properties of the adhesive in relation to the first element, and the desired thickness of the adhesive layer.

For thin adhesive layers of <20 µm, the viscosity of the adhesive may be at most 6,000 mPas at 25° C. For thin adhesive layers of <10 µm, the viscosity of the adhesive may be at most 1,000 mPas at 25° C. For adhesive layers of 20 µm to 50 nm, for example, 50 µm, the viscosity of the adhesive may be at most 40,000 mPas at 25° C.

In a further embodiment, method step D) comprises the following method steps:
  D1) activating and pre-curing the adhesive, and
  D2) the completion of curing under heat.

Method step D2) may be performed directly or with a time delay in relation to method step D1). In method step D1), the adhesive may be partly cured, and in method step D2) the partial curing may be at least largely brought to completion.

The adhesive strength of the cured adhesive may be further improved by the additional heat curing step. As a result of the partial pre-curing, the heat curing may be carried out at lower temperatures and/or over a shorter time than conventionally used heat curing procedures.

In a further embodiment, the adhesive is cured in method step D) by exposure to a radiation source. In this way, the adhesive may be cured only by means of a radiation source or be pre-cured with a radiation source, that is to say only partly cured, and then curing may be completed under heat. As a result of curing with a radiation source, no fixing aids or holding devices are required to meet the desired geometrical size tolerances. The radiation source may emit electromagnetic radiation with wavelengths of below 500 nm (called a light source below) or electromagnetic radiation in the UV-B and UV-A range (called a UV radiation source below). Preferably, G radiators are used. Particularly preferably, F radiators are used, displaying an emission spectrum according to FIG. 13.

In a further embodiment, exposure is performed using a UV radiation source or a light source for at most 120 seconds. For example, it is possible to perform exposure for 10 s, 20 s, 30 s or 60 s.

For example, exposure is performed for 60 s with an irradiation output of 60 mW/cm$^2$ to 100 mW/cm$^2$. In this case, as a result of the long processing time, it is already possible to achieve sufficient curing of the adhesive. According to an embodiment, the completion of curing under heat may not be required if there is exposure for 60 s with an irradiation output of 60 mW/cm$^2$ to 100 mW/cm$^2$. With a UV radiation source or light source, the emitter may be a panel emitter. The surface output of these emitters in use may be 40 mW/cm$^2$ to 500 mW/cm$^2$.

According to a further embodiment, exposure is performed using a UV radiation source or a light source for 20 seconds with a radiation output of approximately 3,000 mW/cm$^2$. In this case, as a result of the long processing time, it is already possible to achieve sufficient curing of the adhesive. According to an embodiment, the completion of curing under heat may not be required if there is exposure for 20 s with an irradiation output of 3,000 mW/cm$^2$. In this case, the radiation source may be a spot emitter.

The adhesive may be a one-pack adhesive. One-pack adhesives cure as a result of a change in the ambient conditions, such as an increase in temperature or the action of electromagnetic radiation. One-pack adhesives may be stored for certain periods without curing. For example, adhesives of this kind may be stored at room temperature for at least six months and at approximately 5° C. for at least 12 months.

The adhesive may be a UV-curing or light-curing adhesive. In UV-curing or light-curing adhesives, the curing is initiated by the action of electromagnetic radiation. UV-curing or light-curing adhesives may be cured within very short processing times, as a result of which the required high throughput rates for mass production may already be provided.

The adhesive may be a cationically curing adhesive. Cationically curing adhesives may, after sufficient activation using UV radiation or light, undergo further curing in the dark.

For example, the pre-curing according to method step D1) may be performed for 30 seconds with a radiation output of 40 mW/cm$^2$ to 100 mW/cm$^2$ or for 10 seconds with a radiation output of 3,000 mW/cm$^2$. The completion of curing under heat according to method step D2) may be performed at temperatures of 130° C. or above for 0.5 to 4 hours, for example, at 150° C. for two hours.

In a rapid procedure triggered by light or UV initiation, UV-curing or light-curing adhesives quickly enter a gel phase which already allows them to be pre-fixed. Using an adhesive of this kind allows rapid and precise fixing of the first and second elements that are to be bonded. Then, the already pre-fixed elements can undergo complete curing, directly following the UV or light pre-curing or after a delay. The completion of curing under heat may be performed without pressure and without additional auxiliary measures such as fixing, since the elements to be bonded retain their alignment in relation to one another. This means that the level of technical complexity is kept very low.

The rapid curing and where appropriate also initial curing of the UV-curing or light-curing adhesive has the further advantage that it can be performed at any desired temperature, which may be selected with regard to the later operating temperature of the optoelectronic component. Temperatures for curing and where appropriate initial curing which lie below the operating temperature are selected. In particular, temperatures below the operating temperature are selected if the first and the second element contain different materials having different heat expansion coefficients, in order to avoid permanent heat stresses in the first and the second element. Preferably, the UV or light induced curing or where appropriate pre-curing of the adhesive is performed at temperatures as low as possible, in particular at temperatures of up to 60° C. Stress-reduced bonding is moreover characterized by higher stability, and can be carried out reproducibly. Moreover, possible slight yellowing of the adhesive layer in method step D) is minimized.

When a transparent second element is bonded to a first element, exposure of the adhesive may take place through the first or second element. For example, exposure may take place through a substrate, which is formed, for example, from sapphire, glass or synthetic material, of a semiconductor layer sequence and onto the adhesive, as a result of which the adhesive layer is formed. If the first and the second element are constructed to be transparent, exposure may take place through both elements. Bonding a transparent first and/or second element gives high adhesive strengths in the adhesive layer.

The method is particularly suitable for bonding two elements if at least one of these elements contains sapphire. At least the element containing sapphire may be constructed to be transparent. Exposure of the adhesive may then take place at least through the transparent element containing sapphire. Once the adhesive has cured, bonding of the first and the second element by the adhesive layer is particularly good if at least one element contains sapphire. Shear strengths of over 38 N/mm$^2$ can be achieved.

The technical complexity of the method can be kept low if the substrate of an active semiconductor layer sequence contains sapphire, since this can be bonded to a first element without previous cleaning or polishing.

It is also possible for the first or second element to be a sapphire framework. Sapphire frameworks may be bonded to the above-mentioned active semiconductor layer sequences, substrates, potting substances and carriers. The adhesive may be applied to the sapphire frame and/or the active semiconductor layer sequence, the substrate, the potting substance or the carrier. Preferably, the adhesive is applied only to the active semiconductor layer sequence, the substrate, the potting substance or the carrier.

Further, the use of an adhesive which includes at least a first difunctional or polyfunctional epoxy resin, an accelerator and an adhesion promoter to form adhesive layers between elements in optoelectronic components is specified. Further, the adhesive may also contain an aliphatic or cycloaliphatic alcohol.

The use of the adhesive may be applied in the method according to at least one of the above-mentioned embodiments. Further, the adhesive layer of the optoelectronic component according to at least one of the above-mentioned embodiments may be produced by the above-mentioned embodiments and the embodiments below for use of the adhesive.

In a further embodiment for the use of the adhesive to form adhesive layers between elements in optoelectronic components, at least one element contains sapphire. In particular, if a first and/or a second element between which an adhesive layer is to be formed contains sapphire, the bonding of the two elements by the adhesive layer is particularly good. The good bonding prevents premature delamination of the elements and thus allows the service life of the optoelectronic component to be extended. Shear strengths of over 38 N/mm$^2$ can be achieved. The high adhesive strength of elements containing sapphire is attributable among other things to van der Waals interactions between the adhesive layer and the element containing sapphire. Hydrogen bridges between functional groups of the adhesive layer and the OH groups of the elements comprising sapphire may also contribute to high adhesive strength.

The first difunctional or polyfunctional epoxy resin may be selected from a group comprising hydrogenated or unhydrogenated aromatic diglycidyl ethers, diglycidyl esters, glycidyl ethers, epoxidized olefins and cycloaliphatic epoxy resins. According to an embodiment, there are selected as the difunctional or polyfunctional epoxy resins diglycidyl ethers of bisphenol-A, diglycidyl ethers of bisphenol-F, difunctional or polyfunctional Phenol Novolac epoxy resins and/or 3,4-epoxycyclohexylmethyl-3,4-epoxycyclohexane carboxylate. Polyfunctional epoxy resins are typically more viscous and more strongly colored than difunctional epoxy resins. Moreover, polyfunctional epoxy resins may bring about a higher glass transition temperature in the adhesive layer than difunctional epoxy resins. It is possible for the polyfunctional epoxy resins to be solids.

Preferably, the first difunctional or polyfunctional epoxy resin is of high purity. The purity may be between 90% and 100%, preferably between 95% and 100% and particularly preferably between 97% and 100%. Thus, for example, only a small proportion of oligomers may be present in the epoxy resin. The epoxy resin may be purified by distillation to increase the purity. A purification of solid epoxy resins by recrystallization is also possible. After a purification by distillation or purification by recrystallization, it is also possible to attain an improvement in the stability to yellowing. Further, the epoxy resin may have little inherent color and so may be transparent. The inherent color has, for example, an APHA value (DIN EN ISO 6271-2) of at most 75. In particular, the inherent color has, for example, an APHA value of less than 50.

The accelerator primarily triggers the chemical crosslinking of the adhesive and supports the chemical reaction of the curing process. The chemical crosslinking takes place, for example, by way of a cationic mechanism. The accelerator may comprise a cationic photoinitiator, in particular a UV-cationic photoinitiator. Examples of cationic photoinitiators are alkylated and aromatic sulfonium and iodonium salts. Anions which may be used in the salts are, for example, $AsF_6^-$, $PF_6^-$, $SbF_6^-$ and $BF_4^-$. According to an embodiment, the accelerator used is an aromatic sulfonium salt. The accelerator may be used in solid form or dissolved. A suitable solvent is, for example, propylene carbonate. For example, the accelerator may comprise at least one triarylsulfonium hexafluoroantimonate salt. It is also possible for the accelerator to comprise diphenyl(4-phenylthiophenyl)sulfonium hexafluoroantimonate. The accelerator may be Unicure UVI 6976. Unicure UVI 6976 comprises mixtures of triarylsulfonium hexafluoroantimonate salts which contain diphenyl(4-phenylthiophenyl)sulfonium hexafluoroantimonate.

The adhesion promoter may be selected from a group comprising organofunctional silanes. Organofunctional silanes may, for example, be trialkoxysilane compounds such as γ-glycidoxypropyl trimethoxysilane or γ-glycidoxypropyl triethoxysilane. In particular, the alkyl radicals may not contain any functional groups which have a basic effect, such as amines. Alkyl radicals which do not have a basic effect are preferred. In particular, the alkyl radicals may have OH, epoxy or acrylic functions. In this way, the storage life of the adhesive may be extended and good adhesive crosslinking may be ensured. The organofunctional silanes may be substituted by glycidyl ethers such as trimethoxypropylglycidyl ether.

If the adhesive also contains an aliphatic or cycloaliphatic alcohol, the latter may be selected from a group comprising ethanol, 1,2-propanediol, 1,4-butanediol, 1,6-hexanediol, tricyclodecanedimethanol, cyclohexanedimethanol, 2-ethyl-2-(hydroxymethyl)-1,3-propanediol, diethylene glycol, triethylene glycol, polyether polyols, dipropylene glycol, diethylene glycol monoalkyl ether, glycerine and isosorbide. In particular, the alcohol may be tricyclodecanedimethanol. The rheological, mechanical and thermomechanical properties and the wetting and flow behavior of the adhesive on the first element may be adjusted by adding the aliphatic or cycloaliphatic alcohol to give the desired application form and desired size of the drops of adhesive. By adding the aliphatic or cycloaliphatic alcohol, it is furthermore possible to obtain an adhesive layer having the desired target glass transition temperature (Tg). This ensures that the component will operate reliably under the thermomechanical stress conditions that occur when voltage is applied. The Tg that is adjusted is also largely maintained over the service life of the component without any substantial impairment under load from heat, light or moisture. The Tg of the adhesive layer lies in a range from 100° C. to 180° C., preferably in a range from 130° C. to 160° C. and particularly preferably in a range from 140° C. to 160° C. Adding the aliphatic or cycloaliphatic alcohol can reduce yellowing in the adhesive layer.

In a further embodiment for the use of the adhesive to form adhesive layers between elements in optoelectronic components, the adhesive comprises:
  50% to 99% by weight of a first difunctional or polyfunctional epoxy resin,
  0.3% to 5% by weight of an accelerator,
  >0% to 20% by weight of an aliphatic or cycloaliphatic alcohol, and
  >0% to 5% by weight of an adhesion promoter.
Here and below, ">0" means that the compound is present in the adhesive, that is to say it makes up more than zero % by weight. It is also possible for the adhesive to include 50% to 99% by weight of a mixture of a plurality of first difunctional or polyfunctional epoxy resins. The proportion of the accelerator is in particular between 0.3% and 2% by weight. In this way, the storage life of the adhesive may be extended.

This composition of the adhesive layer has the effect that the adhesive layer formed does not display, or displays a particularly low degree of, yellowing, clouding or changes to its mechanical properties as a result of the loads from heat, moisture and radiation to which it may be exposed in an optoelectronic component. In this way the light yield is not reduced, or is reduced only to a particularly small extent, and the radiation characteristics of the optoelectronic component are not changed or are changed only very slightly if the adhesive layer formed is located in the ray path of the radiation emitted, for example, from an LED.

In a further embodiment, the adhesive is a one-pack adhesive. One-pack adhesives cure as a result of changes in the ambient conditions. One-pack adhesives may be stored for certain periods without curing.

In a further embodiment, the adhesive may be stored at room temperature for at least six months. It is also possible to store the adhesive in a refrigerator at 5° C. for at least twelve months. In this way, the application is less technically demanding than, for example, those using conventional adhesives which have to be stored at −15° C.

In a further embodiment, the adhesive is UV-curing or light-curing. Curing of the adhesive is initiated by electromagnetic radiation. The electromagnetic radiation may be visible light or UV light. UV-curing or light-curing adhesives may be cured within short times.

In a further embodiment, the adhesive is a cationically curing adhesive. Cationically curing adhesives cure as a result of crosslinking by a cationic mechanism, initiated, for example, by UV light or visible light of <500 nm.

In a further embodiment for forming adhesive layers between elements in optoelectronic components, the adhesive is transparent. Thus, the adhesive layer formed from the adhesive is also transparent and may be arranged in the ray path of the radiation emitted by the active semiconductor layer sequence.

In a further embodiment, the adhesive comprises at least one further constituent which is selected from a group comprising an aliphatic or cycloaliphatic alcohol, a second difunctional or polyfunctional epoxy resin, a reactive thinner, a polyvinyl ether, a polyether polyol, a yellowing stabilizer, a thixotropic agent, spacers, an optical brightener, a deaerating agent, a wetting agent and a flow control agent or combinations thereof. Particularly preferably, the adhesive comprises as the at least one further constituent an aliphatic or cycloaliphatic alcohol.

The second difunctional or polyfunctional epoxy resin may be selected from a group comprising hydrogenated or unhydrogenated aromatic diglycidyl ethers, diglycidyl esters, glycidyl ethers and epoxidized olefins, bis(3,4-epoxycyclohexylmethyl)dicarboxylates and cycloaliphatic epoxy resins. According to an embodiment, as the second difunctional or polyfunctional epoxy resin there is selected an epoxy resin as the reaction product of bisphenol-A having ethylene oxide or propylene oxide units of different lengths with epoxy groups in the α/ω position, 1,4-butanediol diglycidyl ether, α/ω-hexanediol diglycidyl ether, diglycidyl esters of hexahydrophthalic acid, diglycidyl esters of methylhexahydrophthalic acid anhydride, glycidylated trimethylolpropane, glycidylated castor oil, bisphenol-A and bisphenol-F glycidyl ethers, phenol-Novolac epoxy resins, cyclohexanedimethylol diglycidyl ether, sorbitol glycidyl ether, diglycidyl ethers of tricyclodecane dimethanol and bis(3,4-epoxycyclohexylmethyl) adipate. The term α/ω position should be understood to mean that the epoxy groups are respectively situated at the beginning and end of the molecular structures. For example, the second difunctional or polyfunctional epoxy resin may comprise the commercially available epoxy resin EP-4005 from Asahi Denka. According to an embodiment, there are selected as the difunctional or polyfunctional epoxy resins diglycidyl ethers of bisphenol-A, diglycidyl ethers of bisphenol-F and/or 3,4-epoxycyclohexylmethyl-3,4- epoxycyclohexane carboxylate.

The reactive thinner may comprise a third epoxy resin. It may have an influence on the Tg and viscosity. The reactive thinner may be selected from a group comprising hydrogenated or unhydrogenated aromatic diglycidyl ethers and glycidyl ethers. According to an embodiment, the reactive thinner is selected from o-cresyl glycidyl ether, neopentylglycol diglycidyl ether, 2-ethylhexyl glycidyl ether, p-tert-butylphenyl glycidyl ether, nonylphenol glycidyl ether, and aliphatic and monofunctional glycidyl ethers. Monofunctional glycidyl ethers may comprise 8 to 10 or 12 to 18 carbon atoms. Overall, the Tg of the adhesive layer may be adjusted by a suitable selection of the first and—if present—the second and third epoxy resin. Preferably, the reactive thinner comprises monofunctional glycidyl ethers having 8 to 10 carbon atoms.

The polyether polyol may be selected from a group comprising glycols and glycolmonoalkyl ethers. According to an embodiment, there is selected as the polyether polyol diethylene glycol, triethylene glycol, dipropylene glycol, tripropylene glycol and monoethyl ethers of the said compounds.

As yellowing stabilizers, which may, for example, be antioxidants or UV absorbers, there may be used, for example, sterically hindered phenols, cresols and anisols, and phosphites, phosphonites and/or lactone compounds. According to an embodiment, the yellowing stabilizers are selected from thioester-3-tert-butyl-4-hydroxyanisol and 5,7-di-tert-butyl-3-(3,4-dimethylphenyl)-3H-benzofuran-2-one. Yellowing stabilizers are commercially available, for example, under the trade names Irgafos, Irganox and Tinuvin.

As thixotropic agents there serve, for example, finely dispersed $TiO_2$, $Al_2O_3$ and/or $SiO_2$. Thixotropic agents serve to adjust the rheology and flow properties of the adhesive.

The spacers comprise inorganic materials, such as glasses, for example, $SiO_2$ and $Al_2O_3$. Furthermore, the spacers may be spherical. In this case, the spacers have a narrow grain size distribution, that is to say the particle size distribution is as narrow as possible, as a result of which as homogeneous as possible a thickness of the adhesive layer can be achieved. The spacer particles preferably have a size of between 1 μm to 20 μm, which can be selected in dependence on the desired layer thickness of the adhesive layer. According to an embodiment, spherical glass particles are used as the spacers.

The optical brighteners comprise, for example, epoxy casting resins which have been colored blue, in which case the blue coloring may be generated by organic blue colorants.

The deaerating agents, wetting agents and flow control agents may comprise functional silicones, organic fluorine compounds, polyesters and polysiloxane copolymers which have, for example, been polyether-modified. The wetting agents and flow control agents may contribute to adjusting the wetting and flow behavior of the adhesive on the first element.

In a further embodiment, the use of the adhesive is specified wherein the adhesive additionally comprises at least one further component in the following proportions or combinations thereof, wherein the components are selected from the following:
  aliphatic or cycloaliphatic alcohol: up to and including 20% by weight,
  second difunctional or polyfunctional epoxy resin: up to and including 40% by weight,
  reactive thinner (third epoxy resin): up to and including 20% by weight,
  polyvinyl ether: up to and including 20% by weight,
  polyether polyol: up to and including 20% by weight,
  yellowing stabilizer: up to and including 5% by weight, thixotropic agent: up to and including 10% by weight,
spacers: up to and including 5% by weight,
optical brighteners: up to and including 5% by weight,
deaerating agents: up to and including 3% by weight, preferably less than 1% by weight,
wetting agents: up to and including 3% by weight, preferably less than 1% by weight,
flow control agents: up to and including 3% by weight, preferably less than 1% by weight.

In particular, the adhesive comprises as at least one further constituent an aliphatic or cycloaliphatic alcohol.

BRIEF DESCRIPTION OF THE DRAWINGS

Further advantageous embodiments and developments of the invention will emerge from the exemplified embodiments, described below with reference to the figures.

In the exemplified embodiments and figures, identical or identically acting components are in each case provided with the same reference numerals. The elements shown and their relative size in relation to one another should not be considered as being to scale, but rather individual elements, in particular layer thicknesses, may be shown exaggeratedly large to assist in understanding.

DETAILED DESCRIPTION OF ILLUSTRATIVE EMBODIMENTS

FIGS. 1 to 8 show schematic side views of various embodiments of optoelectronic components. These are intended to illustrate by way of example the points in optoelectronic components at which adhesive layers according to the above embodiments may be used.

Figure 1:
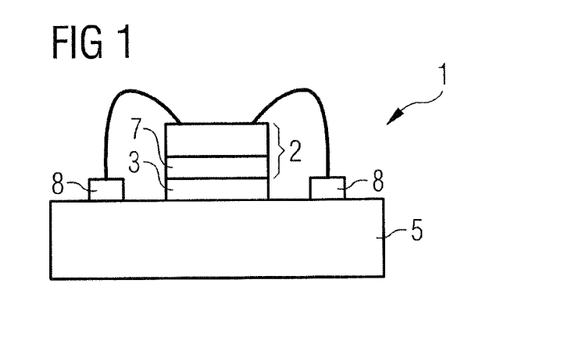
FIGS. 1 to 8 show schematic side views of various embodiments of optoelectronic components.

The optoelectronic component 1 in FIG. 1 shows a carrier 5 having a leadframe 8. Arranged on the carrier 5 is an active semiconductor layer sequence 2 which is electrically connected to the leadframe 8. The active semiconductor layer sequence 2 comprises a substrate 7, which preferably contains sapphire. Arranged between the carrier 5 and the substrate 7 is an adhesive layer 3. The layer thickness of the adhesive layer 3 is, for example, 10 μm. The adhesive layer is produced from an adhesive which includes at least a first difunctional or polyfunctional epoxy resin, an accelerator and an adhesion promoter. The adhesive layers 3 in FIGS. 1 to 8 are created using one of the above embodiments.

Preferably, the optoelectronic component 1 is an LED, wherein the radiation is output either upwards through the semiconductor layer sequence 2, which in this case is constructed to be transparent, and/or downwards through the adhesive layer 3 and the carrier 5, which in this case are constructed to be transparent. If the radiation is output upwards, a reflecting layer may be arranged between the adhesive layer 3 and the carrier 5 in order to increase the light output (not shown here).

As an alternative, instead of the leadframe 8 it is also possible for two electrodes to be arranged on the carrier 5 (not shown here). Various layers of the active semiconductor layer sequence 2 are then connected to the electrodes by way of conductor wires. The adhesive layer 3 is then arranged directly between the carrier 5 and the substrate 7 of the active semiconductor layer sequence 2.

Figure 2:
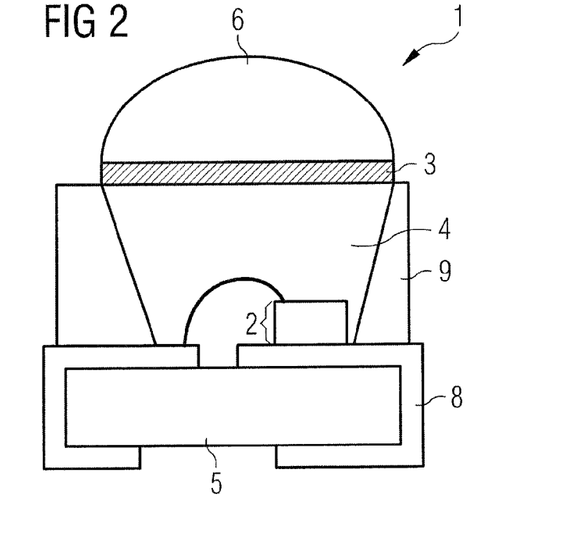

The optoelectronic component 1 in FIG. 2 shows a carrier 5 having a leadframe 8 and a housing 9. In the center the housing 9 has a recess in which the active semiconductor layer sequence 2 which is electrically connected to the leadframe 8 is arranged. The recess is filled with a potting substance 4, which comprises, for example, a polymer. Applied to the potting substance 4 is an adhesive layer 3 having a thickness of, for example, 50 μm. Mounted on this adhesive layer 3 is an optical element 6 such as an optical lens, as shown here. The optical element 6 contains, for example, sapphire and is constructed to be transparent. Preferably, the optoelectronic component 1 is an LED, wherein the radiation is output upwards through a transparent semiconductor layer sequence 2, a transparent potting substance 4, a transparent adhesive layer 4 and a transparent optical element 6.

Figure 3:
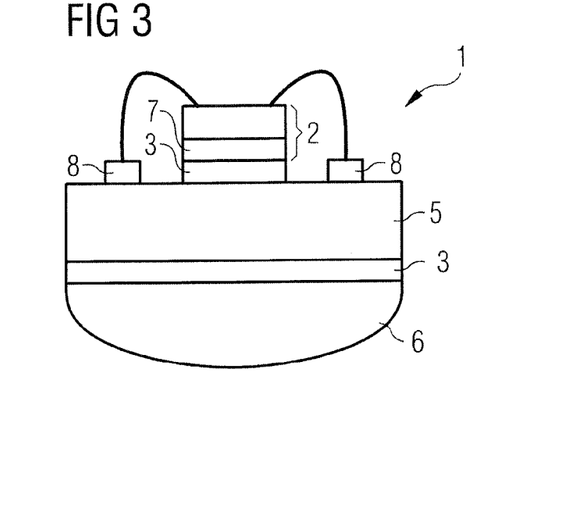

In FIG. 3, by comparison with FIG. 1 a further adhesive layer 3 is applied between the carrier 5 and an optical element 6, such as an optical lens. The further adhesive layer 3 and the optical element 6 are arranged on the side of the carrier 5 remote from the semiconductor layer sequence 2. Preferably, the optoelectronic component 1 is an LED, wherein the radiation is output downwards through the two adhesive layers 3, the carrier 5 and the optical element 6, which in this case are constructed to be transparent.

Figure 4:
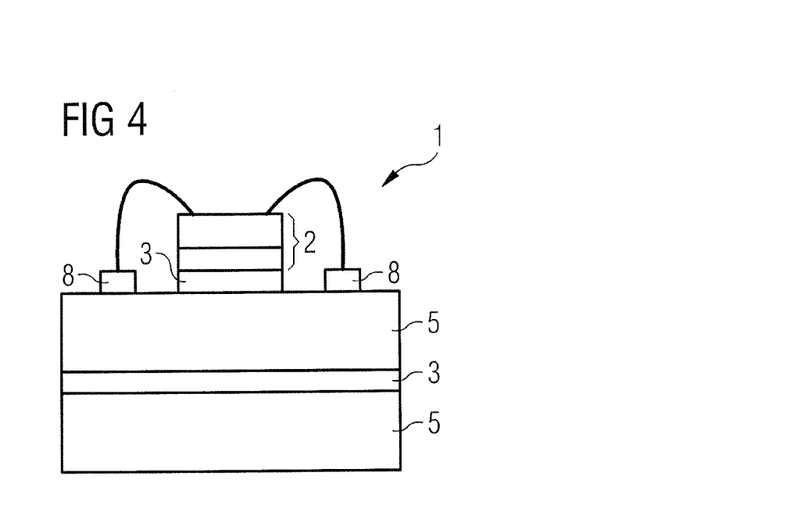

FIG. 4 shows, by comparison with FIG. 1, an optoelectronic component 1, wherein a further adhesive layer 3 is applied between the carrier 5 and a further carrier 5. The further adhesive layer 3 and the further carrier 5 are arranged on the side of the carrier 5 remote from the semiconductor layer sequence 2. As a result of the two carriers 5, the stability of the component 1 is increased.

Figure 5:
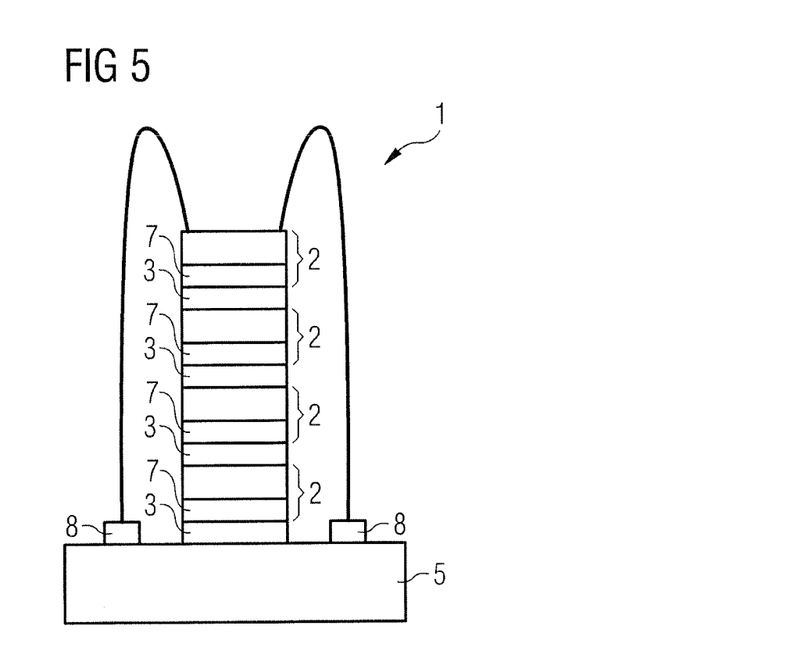

FIG. 5 shows, by comparison with FIG. 1, that above the active semiconductor layer sequence 2 there are arranged three further active semiconductor layer sequences 2, wherein a substrate 7 of an active semiconductor layer sequence 2 is in each case bonded to a further active semiconductor layer sequence 2 by means of an adhesive layer 3. It is also possible for only one, two or more than three further active semiconductor layer sequences 2 to be mounted on the first active semiconductor layer sequence 2.

Figure 6:
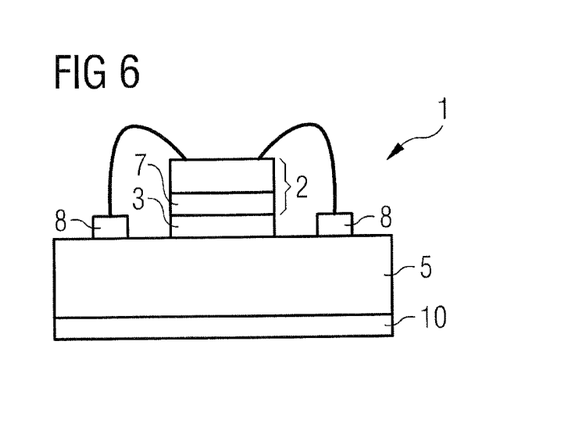

FIG. 6 shows, by comparison with FIG. 1, that a luminescent conversion layer 10 is arranged on the carrier 5. The luminescent conversion layer 10 is mounted on the side of the carrier 5 remote from the active semiconductor layer sequence 2. Preferably, the optoelectronic component 1 is an LED, wherein the radiation is output downwards through the adhesive layer 3, the carrier 5 and the luminescent conversion layer 10. The luminescent conversion layer 10 partly converts, for example, the electromagnetic radiation emitted by the active semiconductor layer sequence 2 into radiation having a different wavelength. The radiation emitted by the component 1 is composed of the radiation emitted by the active semiconductor layer sequence 2 and the converted radiation. In this way, the optoelectronic component 1 may emit, for example, white light.

Figure 7:
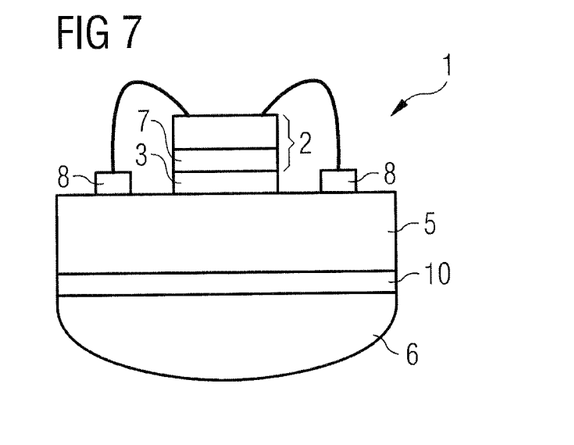

FIG. 7 shows, by comparison with FIG. 3, that instead of a further adhesive layer 3 a luminescent conversion layer 10 is mounted between the carrier 5 and an optical element 6, wherein the luminescent conversion layer 10 and the optical element 6, in this example a lens, are arranged on the side of the carrier remote from the semiconductor layer sequence 2.

Figure 8:
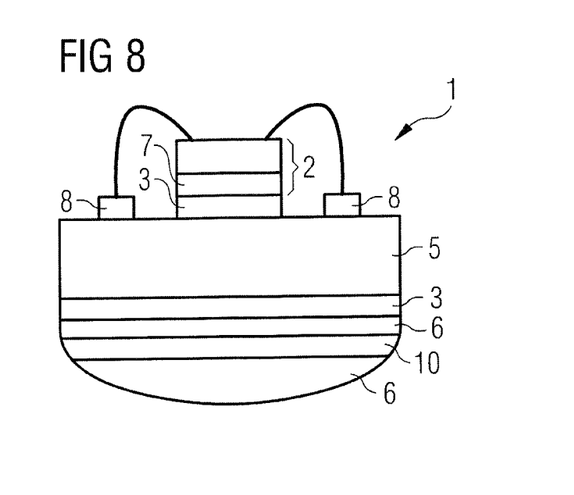

FIG. 8 shows, by comparison with FIG. 3, that a luminescent conversion layer 10 is mounted in between the optical element 6. In this case, the optical element may, for example, be a lens which is divided in two, wherein the adhesive layer 3 is located between the two parts of the lens.

Figure 9:
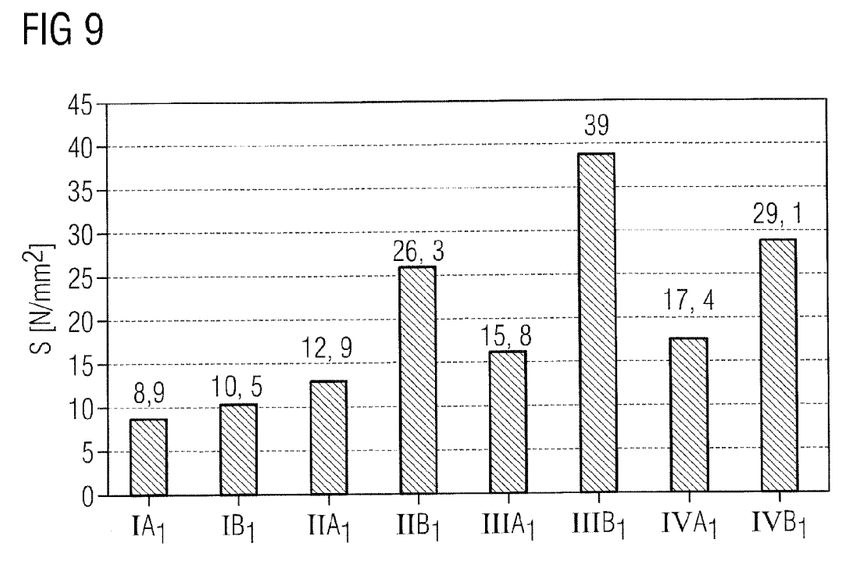
FIG. 9 shows the shear strength of adhesive layers which are arranged between two elements.
Figure 10:
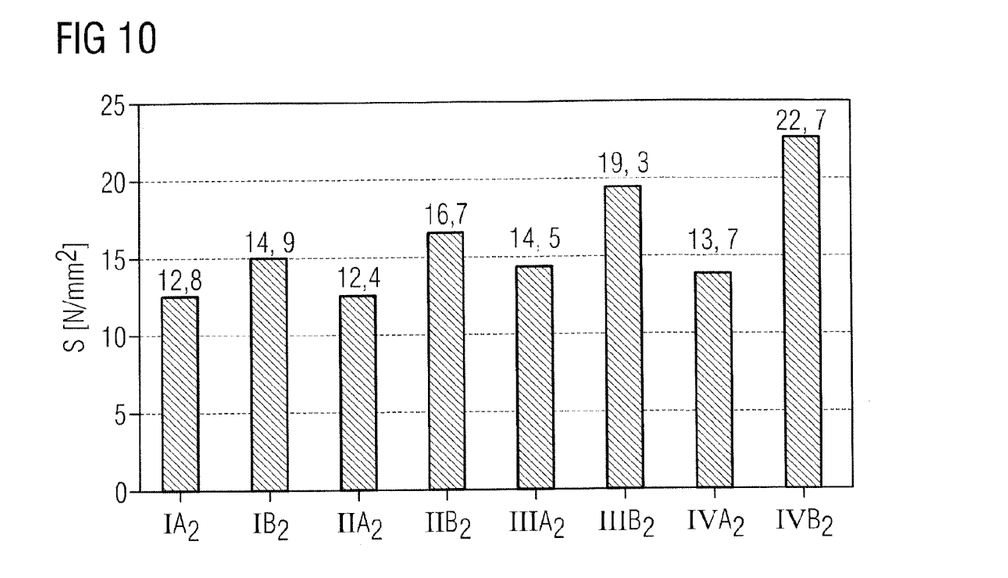
FIG. 10 shows the shear strength of adhesive layers which are arranged between two elements.
Figure 11:
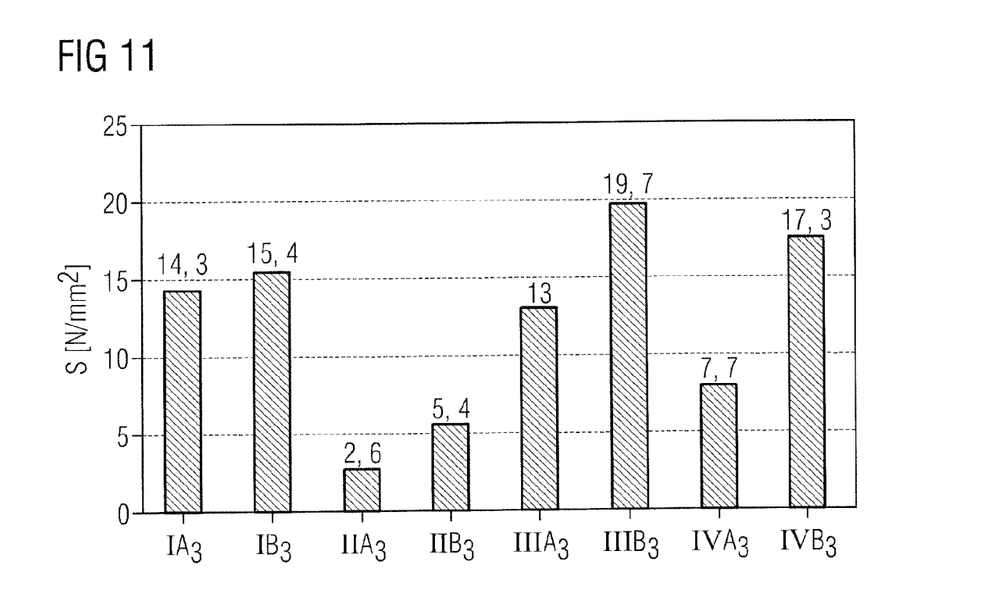
FIG. 11 shows the shear strength of adhesive layers which are arranged between two elements.

FIGS. 9 to 11 show the shear strengths of adhesive layers 3 which are arranged between two elements. In each case, the shear strength S at room temperature in N/mm² is shown along the y axis, and the respectively tested combinations of elements between which an adhesive layer 3 is formed is shown along the x axis. The tested combinations of elements are a sapphire substrate with a layer thickness of 560 µm and a surface measuring 2 mm×2 mm, an adhesive layer 3 with a layer thickness of 10 µm, and a carrier. The materials of the carriers are varied in each case. Accordingly, the combinations are designated as follows:

glass (combinations of elements designated by reference numerals IA1, IB1, IIA1, IIB1, IIIA1, IIIB1, IVA1 and IVB1, FIG. 9), a carrier comprising polyphthalamide, glass and TiO2, for example, Grivory XE3825 (combinations of elements designated by the reference numerals IA2, IB2, IIA2, IIB2, IIIA2, IIIB2, IVA2 and IVB2, FIG. 10), and anodized aluminum (combinations of elements designated by reference numerals IA3, IB3, IIA3, IIB3, IIIA3, IIIB3, IVA3 and IVB3, FIG. 11).

Before the adhesive was applied, the carriers comprising glass/Grivory XE3825/anodized aluminum were cleaned using isopropanol and then dried for 30 minutes at 80° C. In the case of the combinations of elements designated by reference numerals IAx and IBx (x=1, 2 or 3), an adhesive of the following composition was used to produce the adhesive layer 3:

Bisphenol-A epoxy resin: 83.9% by weight
Tricyclodecane dimethanol: 10.0% by weight
Aliphatic C8-C10 glycidyl ether: 5.0% by weight
Siloxane-containing deaerating agent: 0.3% by weight
Triarylsulfonium hexafluoroantimonate (Unicure UVI 6976):0.8% by weight The adhesive is a UV-cationically curing adhesive and has a refractive index $n_D$ of 1.56 at 23° C., a viscosity of 3,000 mPas to 5,000 mPas at 25° C., and a Tg of 110° C.

In the case of the combinations of elements designated by reference numerals IIAx and IIBx (x=1, 2 or 3), an adhesive of the following composition was used to produce the adhesive layer 3:

bis(3,4-epoxyhexylmethyl)dicarboxylate: 86.3% by weight
Tricyclodecane dimethanol: 12.0% by weight
γ-glycidoxypropyl trimethoxysilane: 0.5% by weight
Triarylsulfonium hexafluoroantimonate (Unicure UVI 6976): 1.2% by weight
The adhesive is a UV-cationically curing adhesive and has a refractive index $n_D$ of 1.4994 at 23° C., a viscosity of 400 mPas to 500 mPas at 25° C., and a Tg of 160° C.

In the case of the combinations of elements designated by reference numerals IIIBx and IIIBx (x=1, 2 or 3), an adhesive which is designated O32 and has the following composition was used to produce the adhesive layer 3:

Bisphenol-A epoxy resin: 88.9% by weight
Epoxy phenol Novolac: 10.0% by weight
Siloxane-containing deaerating agent: 0.4% by weight
Triarylsulfonium hexafluoroantimonate (Unicure UVI 6976): 0.7% by weight
The adhesive is a UV-cationically curing adhesive and has a refractive index nD of 1.5752 at 23° C., a viscosity of 18,000 to 22,000 mPas at 25° C., and a Tg of 160° C.

In the case of the combinations of elements designated by reference numerals IVAx and IVBx (x=1, 2 or 3), an adhesive of the following composition was used to produce the adhesive layer 3:

Bisphenol-A epoxy resin: 88.5% by weight
Tricyclodecane dimethanol: 10.0% by weight
γ-glycidoxypropyl trimethoxysilane: 0.5% by weight
Siloxane-containing deaerating agent: 0.2% by weight
Triarylsulfonium hexafluoroantimonate (Unicure UVI 6976): 0.8% by weight
The adhesive is a UV-cationically curing adhesive and has a refractive index $n_D$ of 1.5680 at 23° C., a viscosity of 10,000 mPas to 14,000 mPas at 25° C., and a Tg of 135° C.

Adding the alcohol tricyclodecane dimethanol in the case of the exemplified embodiments designated by I, II and IV makes it easier to apply the adhesive, since the rheological, mechanical and thermomechanical properties are better adjusted and the wetting and flow behavior of the adhesive are improved. Further, adding tricyclodecane dimethanol reduces yellowing of the adhesive layer 3.

The adhesive layers 3 of the combinations of elements designated by reference numerals A, such as IA1, were cured under UV exposure for 60 seconds at a radiation output of 60 mW/cm², and the adhesive layers 3 of the combinations of elements designated by reference numerals B, such as IB1, were cured under the action of UV for 60 seconds at 60 mW/cm² and then subjected to heat after-curing for 2 hours at 150° C.

In each case, 10 combinations of elements of an embodiment were tested. It can be seen from FIGS. 9 to 11 that the adhesive layers 3 that were initially cured under the action of UV already have shear strengths of more than 2.5 N/mm². The already high shear strengths of the adhesive layers 3 can be increased further to up to 39 N/mm² in the combinations of elements by heat after-curing of the adhesive layer 3.

Figure 12:
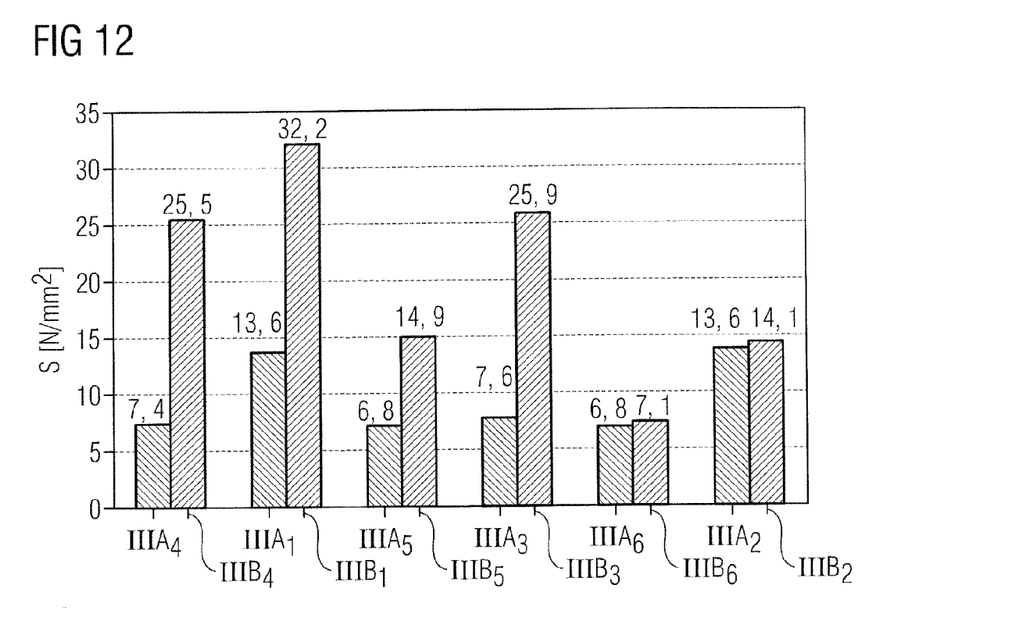
FIG. 12 shows the shear strength of adhesive layers which are arranged between two elements.

FIG. 12 shows shear strengths of adhesive layers 3 which are arranged between two elements. The shear strength S at room temperature in N/mm² is shown along the y axis, and the respectively tested combinations of elements between which an adhesive layer 3 is formed is shown along the x axis. In the tested combinations of elements, the adhesive which is designated O32 was used to produce the adhesive layer 3. The combinations of elements have the following structure:

IIIA4 and IIIB4: glass, adhesive layer 3, quartz substrate 7;
IIIA1 and IIIB1: glass, adhesive layer 3, sapphire substrate 7;
IIIA5 and IIIB5: anodized aluminum, adhesive layer 3, quartz substrate 7;
IIIA3 and IIIB3: anodized aluminum, adhesive layer 3, sapphire substrate 7;
IIIA6 and IIIB6: Grivory XE3825, adhesive layer 3, quartz substrate 7;
IIIA2 and IIIB2: Grivory XE3825, adhesive layer 3, sapphire substrate 7.

The substrate 7 has a layer thickness of 560 µm. The active semiconductor layer sequence 2 is arranged above an adhesive layer 3 having a layer thickness of 10 µm, which is in turn arranged on glass, Grivory XE3825 and anodized aluminum. In each case, 10 combinations of elements of an embodiment were tested. The adhesive layers 3 of the combinations of elements designated by reference numerals A, such as IIIA4, were cured under UV exposure at a distance of 25 mm from a Bluepoint 4 spot emitter for 10 seconds at a radiation output of approximately 2000 mW/cm², and the adhesive layers 3 of the combinations of elements designated by reference numerals B, such as IIIB6, were cured under the action of UV at a distance of 25 mm from a Bluepoint 4 spot emitter for 10 seconds at a radiation output of 2,000 mW/cm² and then curing was completed under heat for 2 hours at 150° C. It can be seen from FIG. 12 that after the UV curing step the adhesive layers 3 have high shear strengths of 6.8 N/mm² and more, and these may be significantly increased by completing the curing under heat. It has been found that the shear strength of the adhesive layer 3 in combination with sapphire substrates is higher than that in combination with quartz substrates.

Figure 13:
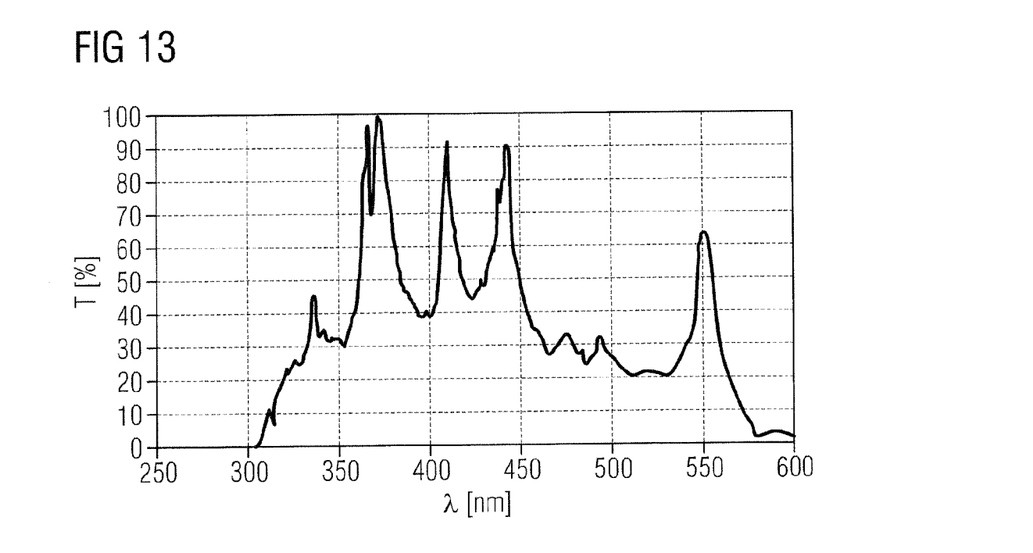
FIG. 13 shows the UV emission spectrum of a Bluepoint four-spot emitter at 100% output.

FIG. 13 shows the UV emission spectrum of a Bluepoint 4 spot emitter at 100% output. It shows the characteristic emission bands of the Bluepoint 4 spot emitter for curing of the adhesive in the UV-A range. The relative intensity I of the radiation is shown in % along the y axis, and the wavelength $\lambda$ is shown in nm along the x axis.

Figure 14:
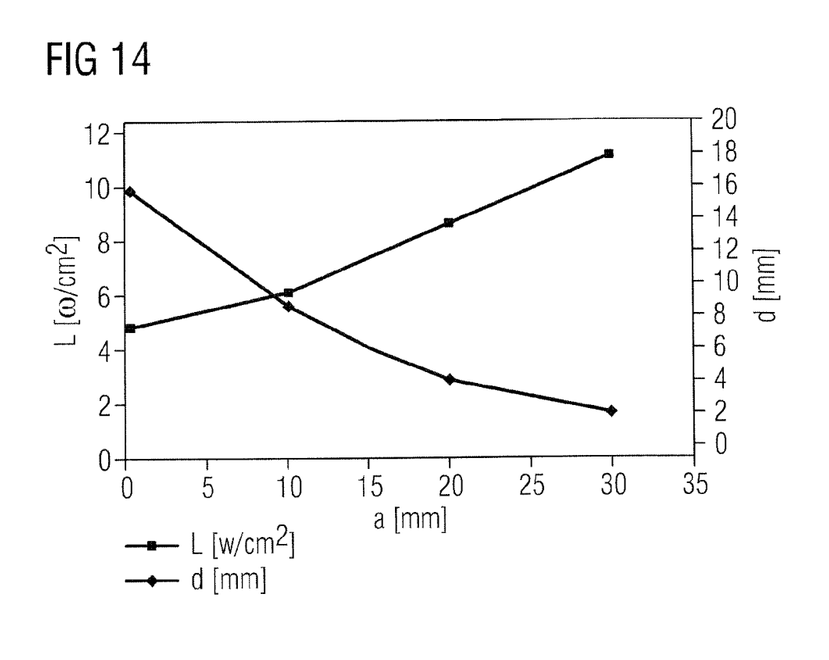
FIG. 14 shows the relationship between the radiation output of a Bluepoint 4 spot emitter and the distance from the object to be exposed to radiation and the diameter of the spot emitter as it meets the object to be irradiated.

FIG. 14 shows the relationship between the radiation output of a Bluepoint 4 spot emitter and the distance from the object to be irradiated and the diameter of the spot emitter as it meets the object to be irradiated. The radiation output L in W/cm² is shown along the left-hand y axis, the diameter d of the spot beam where it meets the object is shown in mm along the right-hand y axis, and the distance a from the object to be irradiated is shown in mm along the x axis. It can be seen, for example, that a spot beam having a diameter of approximately 16 mm and a radiation output of approximately 2 W/cm² meets an object at a distance of 25 mm from the spot emitter.

Figure 15:
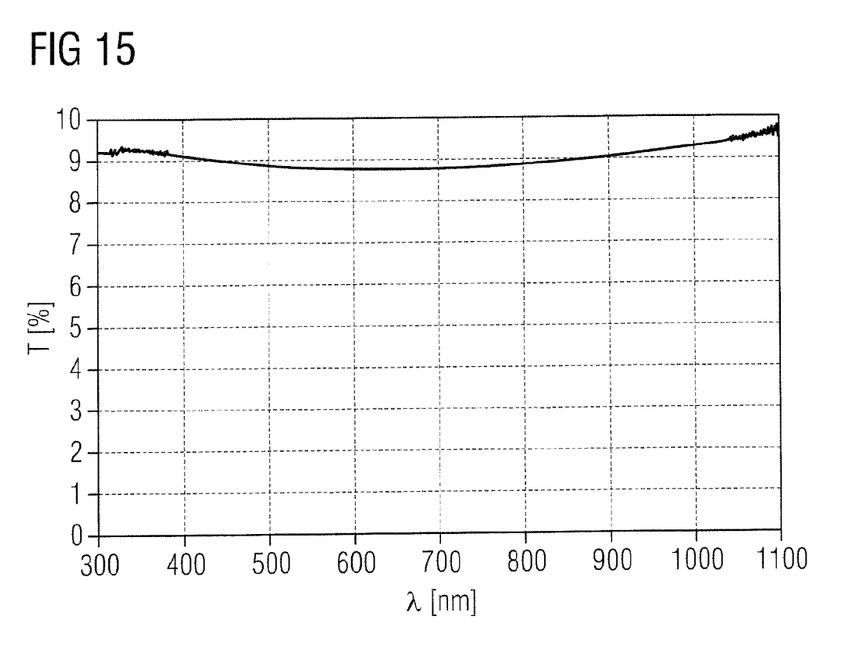
FIG. 15 shows the optical transmittance of a sapphire substrate.

FIG. 15 shows the transmittance of a sapphire substrate having a thickness of 650 μm as a function of the wavelength. The transmittance T is shown in % along the y axis, and the wavelength $\lambda$ is shown in nm along the x axis.

The invention is not limited by the description using the exemplified embodiments. Rather, the invention includes any new feature and any combination of features, including in particular any combination of features in the claims, even if this feature or this combination is not itself explicitly stated in the claims or exemplified embodiments.

The invention claimed is:

1. An optoelectronic component comprising:
   an active semiconductor layer sequence;
   a first element comprising an active semiconductor layer sequence, a potting substance, or a carrier;
   a second element comprising a carrier, an optical element, or a substrate, wherein at least one of the first element and the second element contains sapphire; and
   an adhesive layer between the first element and the second element, wherein the adhesive layer is produced from an adhesive that comprises a first difunctional or polyfunctional epoxy resin, an accelerator, an adhesion promoter, and a cycloaliphatic alcohol, and wherein there is direct contact between the adhesive layer and the sapphire of at least one of the first element and the second element.

2. The optoelectronic component according claim 1, wherein the adhesive layer has a layer thickness of at most 50 μm.

3. The optoelectronic component according to claim 1, wherein the adhesive layer is transparent to radiation emitted by the active semiconductor layer sequence.

4. The optoelectronic component according to claim 1, wherein the second element comprises an optical element selected from the group consisting of lenses, prisms and filters.

5. The optoelectronic component according to claim 1, wherein the first or the second element comprises a carrier comprising a material that is sapphire.

6. A method for producing an optoelectronic component, the method comprising:
   providing a first element;
   applying an adhesive to the first element, the adhesive comprising a first difunctional or polyfunctional epoxy resin, an accelerator, an adhesion promoter, and a cycloaliphatic alcohol;
   positioning a second element such that the adhesive is between the first element and the second element; and
   curing the adhesive so that the first element is adhered to the second element, wherein at least one of the first element and the second element contains sapphire.

7. The method according to claim 6, wherein curing the adhesive comprises:
   activating and pre-curing the adhesive by exposure; and
   completing the curing under heat.

8. The method according to claim 6, wherein the adhesive is cured by exposure to a radiation source.

9. The method according to claim 8, wherein the exposure is performed using a UV radiation source for at most 120 seconds.

10. A method of making an optoelectronic component, the method comprising:
    providing first and second elements, wherein at least one of the first element and the second element contains sapphire; and
    adhering the first element to the second element with an adhesive that comprises a first difunctional or polyfunctional epoxy resin, an accelerator, an adhesion promoter, and a cycloaliphatic alcohol.

11. The method according to claim 10, wherein the first element contains sapphire.

12. The method according to claim 10, wherein the adhesive comprises at least one further constituent selected from the group consisting of:
    a cycloaliphatic alcohol,
    a second difunctional or polyfunctional epoxy resin,
    a reactive thinner,
    a polyvinyl ether,
    a polyether polyol,
    a yellowing stabilizer,
    a thixotropic agent,
    spacers,
    an optical brightener,
    a deaerating agent,
    a wetting agent, and
    a flow control agent, and combinations thereof.

13. The method according to claim 10, wherein the adhesive comprises:
    50% to 99% by weight of a difunctional or polyfunctional epoxy resin,
    0.3% to 5% by weight of an accelerator,
    >0% to 20% by weight of a cycloaliphatic alcohol, and
    >0% to 5% by weight of an adhesion promoter.

14. The method according to claim 10, wherein adhering the first element to the second element comprising curing the adhesive.

15. The method according to claim 14, wherein curing the adhesive comprises curing the adhesive with light.

16. The method according to claim 14, wherein curing the adhesive comprises curing the adhesive with UV radiation.

17. The method according to claim 16, wherein curing the adhesive comprises exposing the adhesive to a UV radiation source for at most 120 seconds.

18. The method according to claim 14, wherein curing the adhesive comprises:
   activating and pre-curing the adhesive by exposure; and
   completing the curing under heat.

\* \* \* \* \*